United States Patent
Liu et al.

(10) Patent No.: US 12,057,540 B2
(45) Date of Patent: Aug. 6, 2024

(54) DISPLAY PANEL AND MANUFACTURING METHOD

(71) Applicant: BOE TECHNOLOGY GROUP CO., LTD., Beijing (CN)

(72) Inventors: Dongni Liu, Beijing (CN); Minghua Xuan, Beijing (CN); Chao Liu, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 681 days.

(21) Appl. No.: 17/283,512

(22) PCT Filed: May 8, 2020

(86) PCT No.: PCT/CN2020/089084
§ 371 (c)(1),
(2) Date: Apr. 7, 2021

(87) PCT Pub. No.: WO2020/248747
PCT Pub. Date: Dec. 17, 2020

(65) Prior Publication Data
US 2021/0399185 A1 Dec. 23, 2021

(30) Foreign Application Priority Data
Jun. 12, 2019 (CN) .......................... 201910505347.4

(51) Int. Cl.
*H01L 21/00* (2006.01)
*H01L 33/00* (2010.01)
*H01L 33/62* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .............................. H01L 33/62; H01L 33/005
See application file for complete search history.

(56) References Cited

U.S. PATENT DOCUMENTS 6,025,901 A * 2/2000 Adachi ............... G02F 1/13452
349/158
6,413,790 B1 * 7/2002 Duthaler ................ B82Y 30/00
438/22

(Continued)

FOREIGN PATENT DOCUMENTS

| CN | 103217845 A | 7/2013 |
| CN | 106710451 A | 5/2017 |

(Continued)

OTHER PUBLICATIONS

Machine translation of CN 109739057, 2023.*

(Continued)

*Primary Examiner* — Richard A Booth
(74) *Attorney, Agent, or Firm* — Brooks Kushman P.C.

(57) ABSTRACT

The present disclosure provides a display panel and a manufacturing method. The display panel includes: a base substrate including a display surface and a display back surface arranged opposite to each other, and a side surface connected to the display surface and the display back surface; a plurality of first wirings on the display surface of the base substrate; a plurality of second wirings on the display back surface of the base substrate; a transition body on the side surface of the base substrate and in contact with the first wirings and the second wirings, a surface of the transition body away from the side surface being a smooth curved surface; and a plurality of connection lines covering an outer surface of the transition body, each first wiring being electrically connected to a corresponding second wiring via a corresponding connection line.

19 Claims, 7 Drawing Sheets

(56) References Cited

U.S. PATENT DOCUMENTS

2013/0049231 A1     2/2013  Miyoshi et al.
2016/0306221 A1*  10/2016  Wang ................ G02F 1/133351
2020/0321426 A1   10/2020  Tang et al.

FOREIGN PATENT DOCUMENTS

| CN | 108878483 A | 11/2018 |
|----|-------------|---------|
| CN | 108957878 A | 12/2018 |
| CN | 109410767 A | 3/2019  |
| CN | 109509776 A | 3/2019  |
| CN | 109739057 A | 5/2019  |
| CN | 110211973 A | 9/2019  |

OTHER PUBLICATIONS

First Office Action for Chinese Application No. 201910505347.4, dated Jul. 31, 2020, 6 Pages.
Second Office Action for Chinese Application No. 201910505347.4, dated Feb. 2, 2021, 7 Pages.
International Search Report and Written Opinion for Application No. PCT/CN2020/089084, dated Jul. 29, 2020, 9 Pages.

* cited by examiner

DISPLAY PANEL AND MANUFACTURING METHOD

CROSS-REFERENCE TO RELATED APPLICATION APPLICATIONS

This application is the U.S. national phase of PCT Application No. PCT/CN2020/089084 filed on May 8, 2020, which claims priority to Chinese Patent Application No. 201910505347.4 filed on Jun. 12, 2019, which are incorporated herein by reference in their entireties.

TECHNICAL FIELD

The present disclosure relates to the field of display technology, in particular to a display panel and a manufacturing method thereof.

BACKGROUND

Micro-Light Emitting Diodes (Micro-LEDs) are receiving the growing attention due to such characteristics as self-luminescence, high luminous efficiency, high contrast, wide operating temperature range, long service life, low power consumption, excellent resistance to water and oxygen, and very rapid response.

Recently, along with the wide application of splicing display and the decrease in a size of a seam, an ultra-narrow bezel is highly demanded in a spliced display panel with the micro-LEDs. In order to reduce the size of the seam for the large-size splicing display and improve the resolution, a double-sided process and a side wiring process are usually adopted. However, there is still room for the improvement in the display panel in terms of ultra-narrow bezel limitation and process reliability.

SUMMARY

In one aspect, the present disclosure provides in some embodiments a display panel, including: a base substrate including a display surface and a display back surface arranged opposite to each other, and a side surface connected to the display surface and the display back surface; a plurality of first wirings formed on the display surface of the base substrate; a plurality of second wirings formed on the display back surface of the base substrate; a transition body arranged on the side surface of the base substrate and in contact with the first wirings and the second wirings, a surface of the transition body away from the side surface being a smooth curved surface; and a plurality of connection lines covering an outer surface of the transition body, each first wiring being electrically connected to a corresponding second wiring via a corresponding connection line.

In a possible embodiment of the present disclosure, the transition body includes a first end portion in contact with the first wiring and a second end portion in contact with the second wiring, and an outer surface of each of the first end portion and the second end portion away from the side surface is arc-shaped at a corner.

In a possible embodiment of the present disclosure, a contact surface between the first wiring and the first end portion is flush with an edge of the base substrate, and a contact surface between the second wiring and the second end portion is flush with the edge of the base substrate.

In a possible embodiment of the present disclosure, an upper end of the first end portion is flush with an outer surface of the first wiring away from the display surface, and a lower end of the second end portion is flush with an outer surface of the second wiring away from the display back surface.

In a possible embodiment of the present disclosure, the transition body includes a colloid, and a coefficient of thermal expansion of the colloid is the same as a coefficient of thermal expansion of the connection line.

In a possible embodiment of the present disclosure, a maximum thickness of the transition body in a direction perpendicular to the side surface does not exceed 10 micrometers.

In a possible embodiment of the present disclosure, the outer surface of the transition body away from the side surface is arc-shaped or elliptic arc-shaped at the corner.

In a possible embodiment of the present disclosure, the display panel further includes a light-shielding colloid covering an outer surface of each connection line.

In another aspect, the present disclosure provides in some embodiments a method for manufacturing a display panel, including: forming a plurality of first wirings on a display surface of a base substrate; forming a plurality of second wirings on a display back surface of the base substrate opposite to the display surface; forming a transition body on a side surface of the base substrate connected to the display surface and the display back surface, the transition body being in contact with the first wirings and the second wirings, and a surface of the transition body away from the side surface being a smooth curved surface; and forming a plurality of connection lines covering an outer surface of the transition body, each first wiring being electrically connected to a corresponding second wiring via a corresponding connection line.

In a possible embodiment of the present disclosure, the forming the transition body on the side surface of the base substrate includes: forming a colloid on the side surface of the base substrate; and heating the colloid so that an outer surface of the colloid away from the side surface is arc-shaped at a corner.

In a possible embodiment of the present disclosure, the forming the colloid on the side surface of the base substrate includes attaching the colloid on the side surface of the base substrate through transfer printing or pad printing.

In a possible embodiment of the present disclosure, the forming the plurality of connection lines on the outer surface of the transition body includes forming the plurality of connection lines on a surface of the transition body away from the side surface through transfer printing or pad printing.

In a possible embodiment of the present disclosure, subsequent to forming the plurality of connection lines on the outer surface of the transition body, the method further includes forming a light-shielding colloid on an outer surface of each connection line through transfer printing or pad printing.

In a possible embodiment of the present disclosure, prior to forming the plurality of first wirings on the display surface of the base substrate, the method further includes cutting a motherboard through a laser cutting process to obtain a plurality of display panels.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

For clarification and conciseness, detailed description about any known function and any known member will be omitted in the embodiments of the present disclosure.

Figure 1:
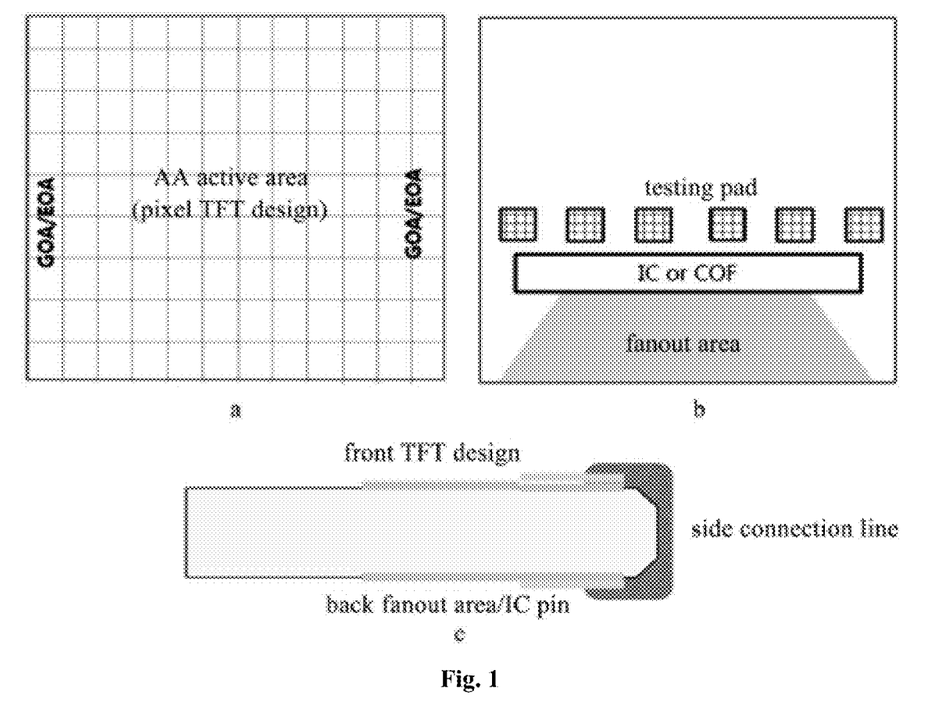
FIG. 1 shows a front view, a back view and a sectional view of a conventional display panel.

In order to provide a micro-LED display panel with an ultra-narrow bezel, reduce a size of a seam for large-size splicing display and improve the resolution, a double-sided process and a side wiring process have been proposed. FIG. 1a is a front view of a conventional display panel, FIG. 1b is a back view of the conventional display panel, and FIG. 1c is a sectional view of the conventional display panel. In FIG. 1, such circuitries such as a pixel circuitry and a shift register are formed on a front surface of the panel, and a fanout area and a chip (Integrated Circuit (IC)/Flexible Printed Circuit (FPC)) are formed on a back surface of the panel. The IC is bonded to the back surface of the panel, and IC signals are transmitted from the Fanout area and a side line to a data line and the shift register on the front surface through side wiring.

Figure 2:
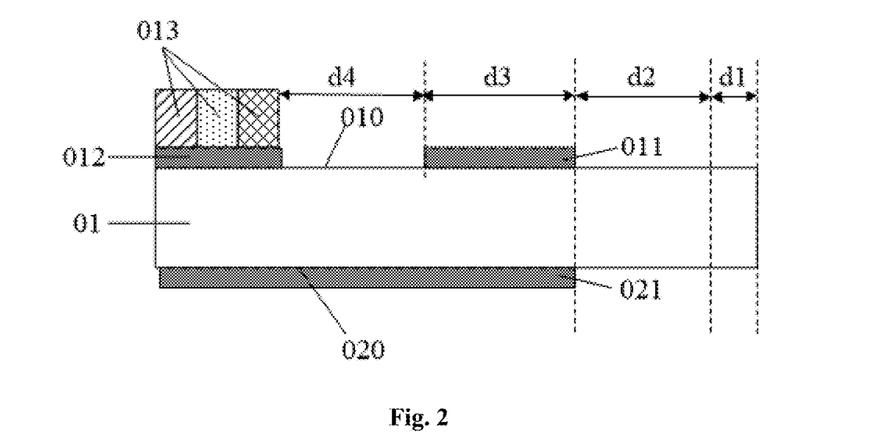
FIG. 2 is a sectional view of the conventional display panel before cutting.
Figure 3:
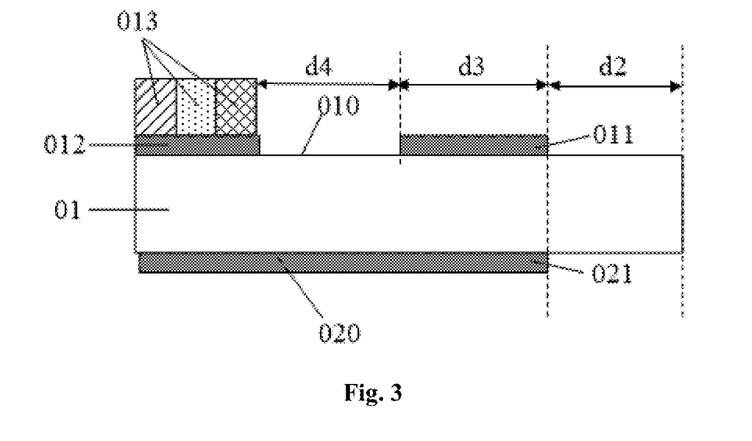
FIG. 3 is a sectional view of the conventional display panel after cutting.
Figure 4:
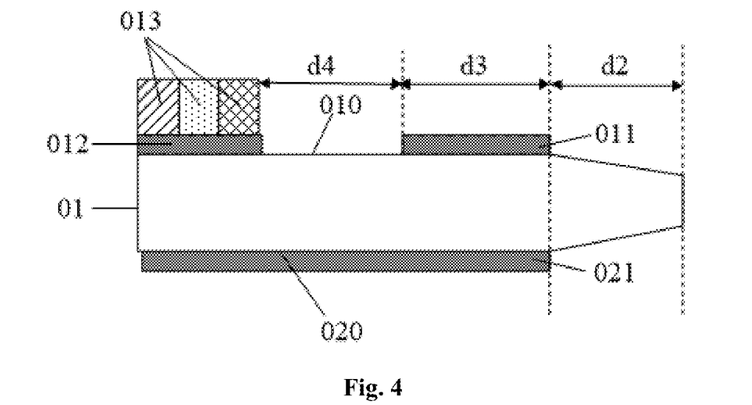
FIG. 4 is a sectional view of the conventional display panel after a chamfering process.
Figure 5:
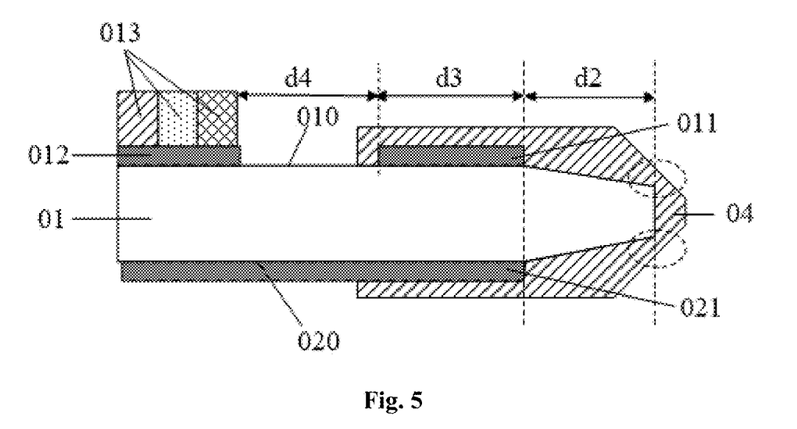
FIG. 5 is a sectional view of the conventional display panel after the formation of connection lines.
Figure 6:
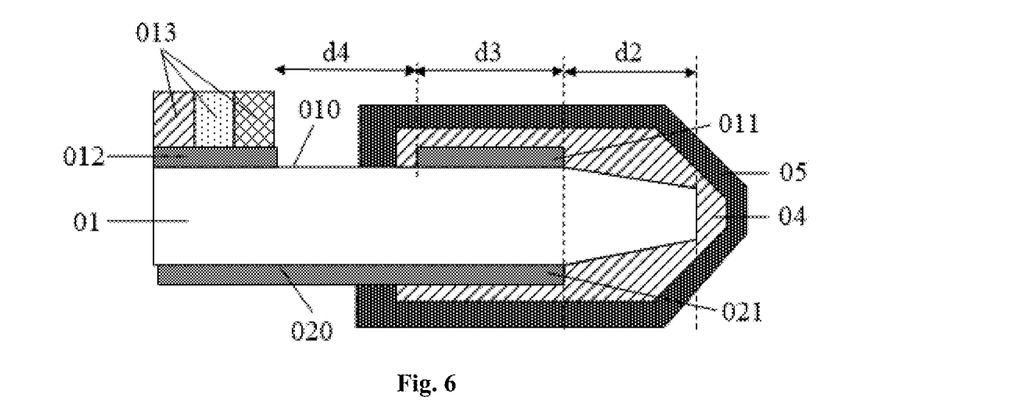
FIG. 6 is a sectional view of the conventional display panel after the formation of a light-shielding colloid.

A typical side wiring process will be described as follows. (1) A glass substrate is cut into display panels through a laser cutting process (a purpose of the laser cutting process is to improve the cutting precision as well as quality of an edge of the panel). FIG. 2 is a sectional view of the conventional display panel before cutting, and FIG. 3 is a sectional view of the conventional display panel after cutting. As shown in FIGS. 2 and 3, the display panel specifically includes a pixel unit 013 positioned in an active area, a wiring 012 in a pixel area, a first wiring 011 on a display surface 010 of a base substrate 01, and a second wiring 021 on a display back surface 020. The base substrate 01 is provided with a laser cutting margin having a width d1, a chamfering margin having a width d2, a side wiring margin having a width d3, and a margin having a width d4 for a light-shielding colloid. (2) Upper and lower edges of the panel are chamfered through a chamfering process (to prevent a side line from being broken at a corner), as shown in FIG. 4. (3) In the side wiring process, corresponding side wiring pins on the front surface and the back surface are connected via a connection line 04 through pad printing or transfer printing, so as to transmit signals for the IC on the back surface, and for the data line and the shift register on the front surface, as shown in FIG. 5. (4) The side wiring is covered with a light-shielding colloid 05 (a Black Matrix (BM) OC material) trough transfer printing or pad printing, as shown in FIG. 6.

The laser cutting precision is +/−20 μm, a minimum size of the chamfering process us about 50 μm-100 μm at present, the precision of the side wiring process is mini. +/−20 μm, and the precision of BM OC is +/−20 μm.

Figure 7:
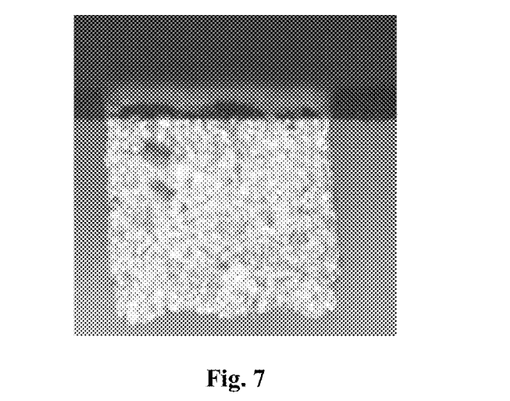
FIG. 7 is a top view of connection lines at a side of the conventional display panel.
Figure 8:
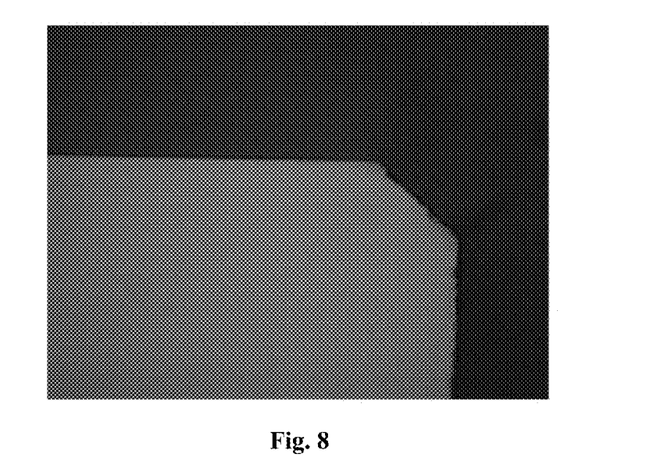
FIG. 8 is a sectional view of the connection lines at a side of the conventional display panel.

In the side wiring process in combination with the above-mentioned precision, the display panel with the ultra-narrow bezel (or the bezel-free display panel) is limited by the size of the chamfering process to the greatest extent. In addition, after the chamfering process, a chamfering angle is, e.g., 45 degrees, and a part of the side line (e.g., at a position indicated by a dotted circle in FIG. 5) is still easy to be broken (an Open defect). FIG. 7 shows the connection lines at a corner after the chamfering process. Further, when the chamfering process is defective (as shown in FIG. 8), the connection lines may also probably be broken.

Figure 9:
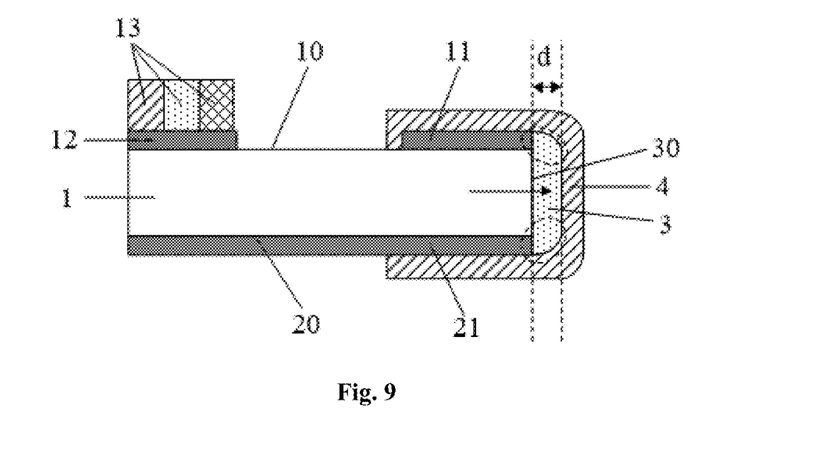
FIG. 9 is a sectional view of a display panel according to one embodiment of the present disclosure.

Based on the above, the present disclosure provides in some embodiments a display panel which, as shown in FIG. 9, includes: a base substrate 1, which includes a display surface 10 and a display back surface 20 arranged opposite to each other, and a side surface 30 connected to the display surface 10 and the display back surface 20 (the base substrate 1 may be, for example, a glass base substrate); a plurality of first wirings 11 arranged on the display surface 10 of the base substrate 1; a plurality of second wirings 21 arranged on the display back side 20 of the base substrate 1; a transition body 3 arranged on the side surface 30 of the base substrate 1 and in contact with the first wirings 11 and the second wirings 21, a surface of the transition body 3 away from the side surface 30 being a smooth curved surface (in a possible embodiment of the present disclosure, the transition body 3 may include a first end portion corresponding to the first wirings 11 (e.g., an upper end of the transition body 3 in FIG. 9) and a second end portion corresponding to the second wirings 21 (e.g., a lower end of the transition body 3 in FIG. 9), and an outer surface of each of the first end portion and the second end portion away from the side surface 30 is arc-shaped at a corner (e.g. at a position indicated by a dotted circle in FIG. 9); and a plurality of connection lines 4 covering the outer surface of the transition body 3, each first wiring 11 being electrically connected to a corresponding second wiring 21 via a corresponding connection line 4.

According to the embodiments of the present disclosure, the display panel may include the plurality of first wirings 11 on the display surface 10, the plurality of second wirings 21 on the display back surface 20, and the transition body 3 on the side surface 30. The outer surface of the transition body 3 away from the side surface 30 may be arc-shaped at the corner. When the transition body 3 is subsequently covered by the connection lines 4, it is able to prevent the connection lines from being easily broken at the corner as compared with the related art. In addition, in the embodiments of the present disclosure, due to the formation of the transition body on the side surface of the display panel, it is unnecessary to perform a chamfering process, i.e., it is able to prevent the occurrence of a wider bezel for the display panel when the base substrate includes a chamfering margin having a large width, thereby to provide the display panel with a narrow bezel.

During the implementation, the first wiring 11 may be specifically a data line, or a line for the other components on the display surface, e.g., a line for providing signals for a shift register. A plurality of connection lines 4 may be provided, and each connection line 4 is configured to connect one first wiring 11 to a corresponding second wiring 21. The upper end of the first end portion of the transition body 3 may be flush with an outer surface of the first wiring 11 away from the display surface 10, and the lower end of the second end portion may be flush with an outer surface of the second wiring 21 away from the display back surface 20. The connection lines 4 may specifically cover the first wirings 11, the second wirings 21 and the transition body 3. In the embodiments of the present disclosure, the display panel may specifically be a display panel with micro-LEDs.

During the implementation, with reference to FIG. 9, an edge of the first wiring 11 may be flush with a right edge of the base substrate 1, i.e., as shown in FIG. 9, a right edge of the first wiring 11 and the right edge of the base substrate 1 may be both in alignment with a second dotted line from the right in FIG. 9. Identically, an edge of the second wiring 21 may be flush with the right edge of the base substrate 1, i.e., as shown in FIG. 9, a right edge of the second wiring 21 and the right edge of the base substrate 1 may be both in alignment with the second dotted line from the right in FIG. 9. In other words, in the embodiments of the present disclosure, one edge of the first wiring 11 may be flush with the right edge of the base substrate 1, and one edge of the second wiring 21 may be flush with the right edge of the base substrate 1.

Of course, according to the specific application and design requirements, the transition body 3 at the right edge of the display panel may also be in engagement with the right edge of the first wiring 11 and/or the second wiring 21 at a position different from that indicated by the second dotted line, as long as the outer surface of the transition body 3 away from the base substrate 1 is a smooth curved surface for the connection lines 4 at the corner.

As mentioned above, during the manufacture, because the chamfering process is not required, it is unnecessary to provide a chamfering margin, so as to remarkably reduce a width of the bezel of the display panel, thereby to provide the display panel with a narrow bezel.

During the implementation, the first wirings 11 and the second wirings 21 may be made of a same material. The transition body 3 may be a colloid, and a coefficient of thermal expansion of the colloid may be the same as that of the connection lines 4. In the embodiments of the present disclosure, during the manufacture, the colloid may be formed in a simple manner on, e.g., attached to, the side surface 30 of the base substrate 1, and there is a strong adhesive force between the transition body 3 and the side surface 30 of the base substrate 1 so as to facilitate the subsequent formation of the connection lines 4 on the outer surface of the transition body 3. Furthermore, when the transition body 3 is the colloid, it may be heated to provide an arc-like shape at the corner, that is, it is able to provide the outer surface of the transition body 3 with an arc-like shape at the corner in a simple manner. In addition, in the embodiments of the invention, when the coefficient of thermal expansion of the colloid is the same as that of the connection lines 4, so it is able to prevent the connection lines 4 from being broken due to different coefficients of thermal expansion when a current flows through the connection lines 4 and the connection lines 4 are heated.

During the implementation, with reference to FIG. 9, in a direction from the base substrate 1 towards the transition body 3 (as indicated by an arrow in FIG. 9), a thickness d of the transition body may be smaller than 10 micrometers, so as to provide the display panel with a narrow bezel.

During the implementation, the outer surface of the transition body 3 away from the side surface 30 may be arc-shaped or elliptic arc-shaped at the corner.

Figure 10:
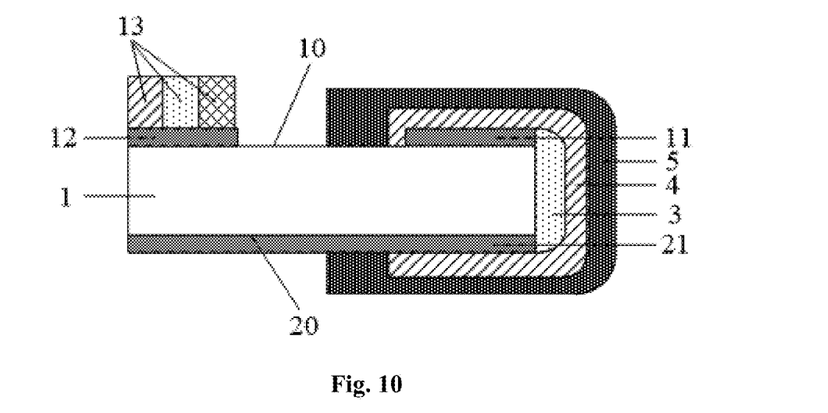
FIG. 10 is a sectional view of the display panel with a light-shielding colloid according to one embodiment of the present disclosure.

During the implementation, referring to FIG. 10, the display panel may further include a light-shielding colloid 5 covering the outer surface of each connection line 4, so as to prevent a display effect of the display panel from being adversely affected when light is reflected by the connection line 4.

Figure 11:
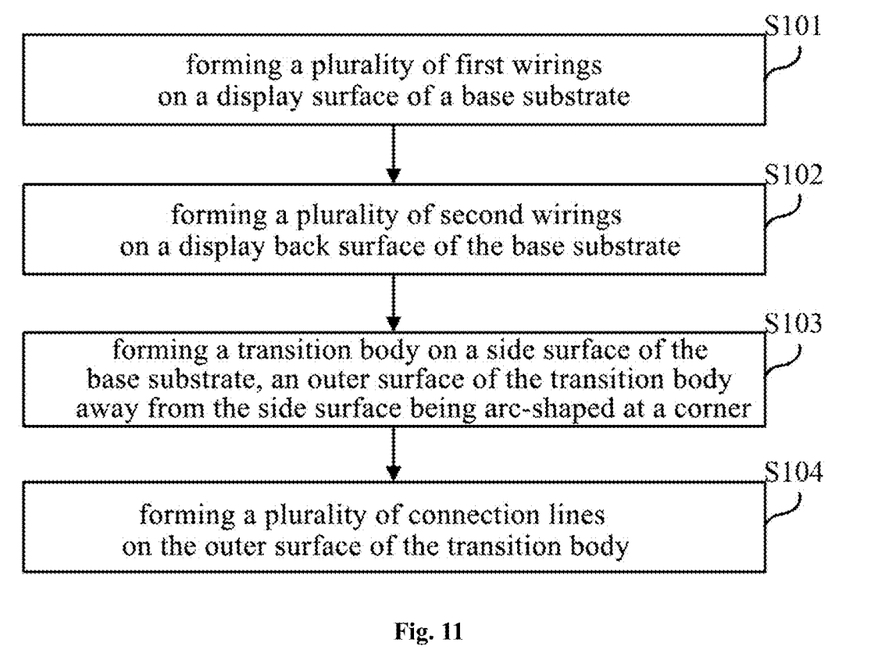
FIG. 11 is a flow chart of a method for manufacturing the display panel according to one embodiment of the present disclosure.

Based on a same inventive concept, the present disclosure further provides in some embodiments a method for manufacturing the above-mentioned display panel which, as shown in FIG. 11, includes: S101 of forming the plurality of first wirings on the display surface of the base substrate; S102 of forming the plurality of second wirings on the display back surface of the base substrate; S103 of forming the transition body on the side surface of the base substrate, the outer surface of the transition body away from the side surface being arc-shaped at a corner; and S104 of forming the plurality of connection lines on the outer surface of the transition body, e.g., through transfer printing or pad printing.

During the implementation, S103 of forming the transition body on the side surface of the base substrate may include the following steps.

S1031: forming the colloid on the side surface of the base substrate. Specifically, the colloid may be formed on the side surface of the base substrate in a simple manner, e.g., through transfer printing or pad printing. Of course, apart from transfer printing and pad printing, the colloid may also be attached through sputtering, spin coating, exposing, or the like.

S1032: heating the colloid so that an outer surface of the colloid away from the side surface is arc-shaped at the corner.

Figure 12:
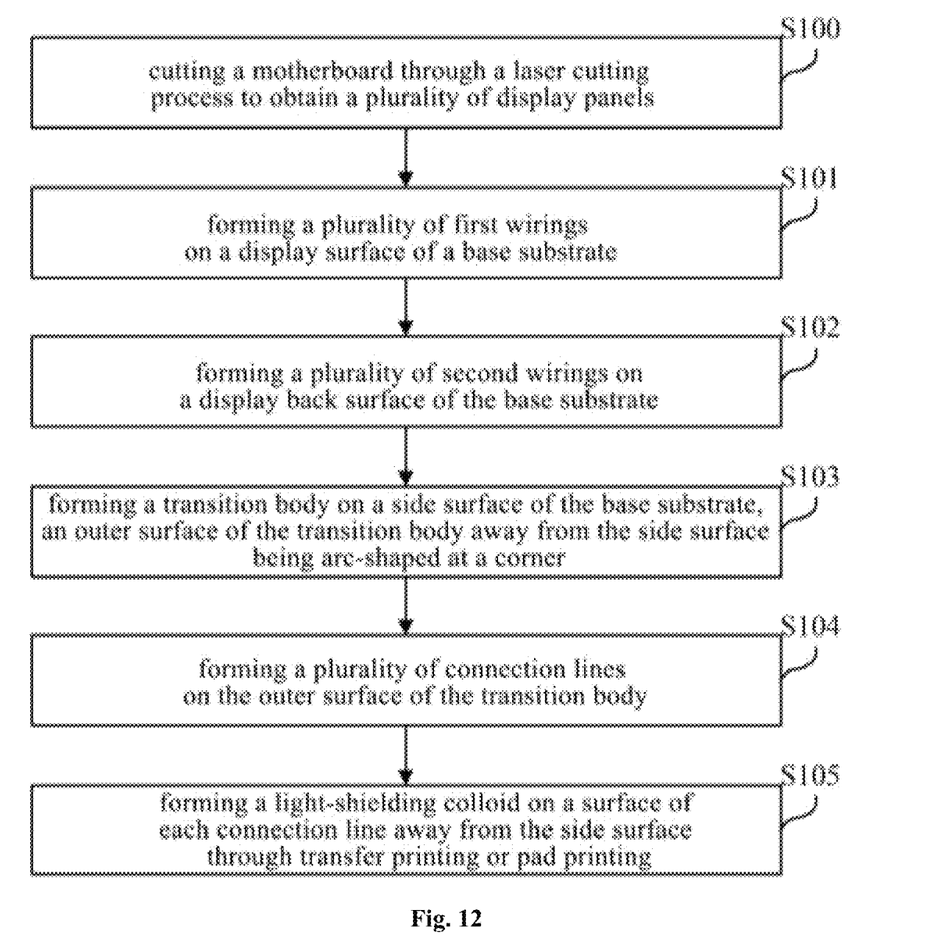
FIG. 12 is another flow chart of the method for manufacturing the display panel according to one embodiment of the present disclosure.

During the implementation, referring to FIG. 12, subsequent to S104 of forming the plurality of connection lines on the outer surface of the transition body, the method may further include S105 of forming the light-shielding colloid on a surface of each connection line away from the side surface through transfer printing or pad printing.

Prior to S101 of forming the plurality of first wirings on the display surface of the base substrate, the method may further include S100 of cutting a motherboard through a laser cutting process to obtain a plurality of base substrates.

As shown in FIGS. 13-16, in the embodiments of the present disclosure, the manufacture of the display panel will be described as follow.

Figure 13:
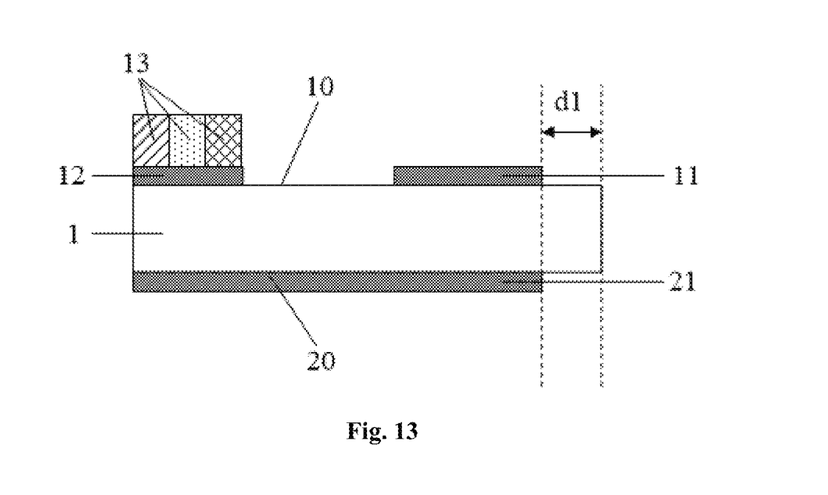
FIG. 13 is a sectional view of the display panel before cutting according to one embodiment of the present disclosure.
Figure 14:
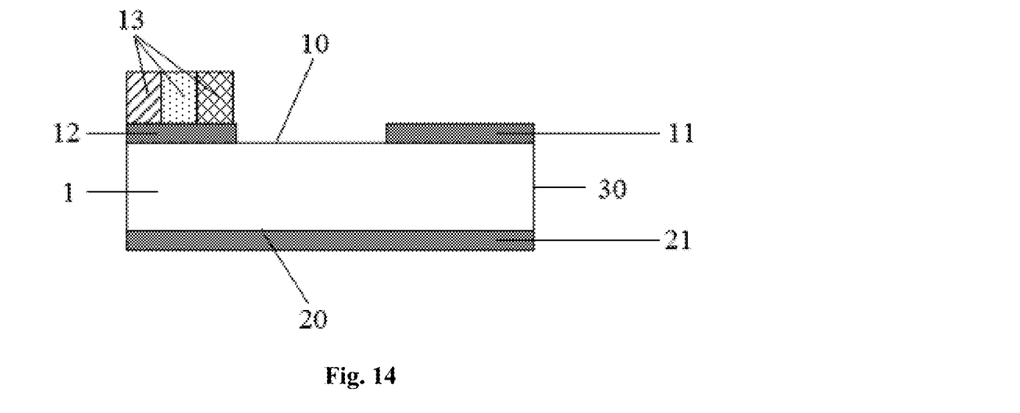
FIG. 14 is a sectional view of the display panel after cutting according to one embodiment of the present disclosure.

Step 1: cutting a glass substrate with circuitries into display panels through a laser cutting process (a purpose of the laser cutting process is to improve the cutting precision as well as quality of an edge of the display panel), as shown in FIGS. 13 and 14. FIG. 13 shows the display panel before cutting, d1 is a width of a laser cutting margin, and FIG. 14 shows the display panel after cutting.

Figure 15:
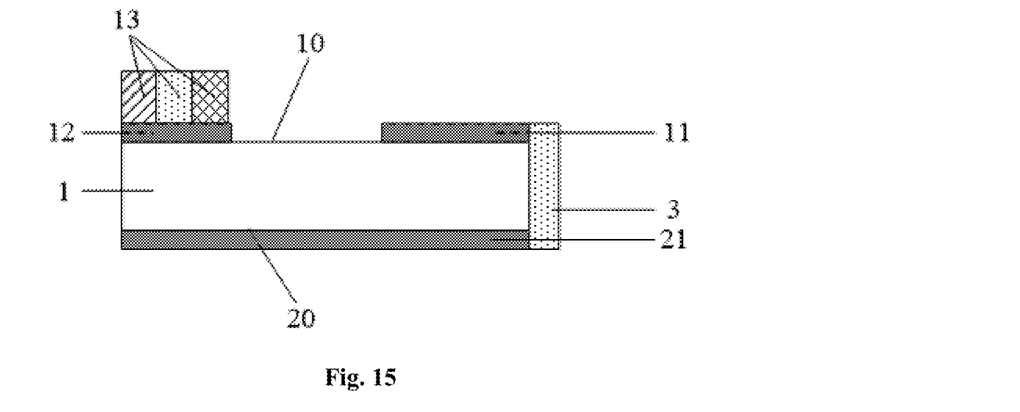
FIG. 15 is a sectional view of the display panel after the formation of a colloid according to one embodiment of the present disclosure.

Step 2: forming the transition body 3 on a side of the line through transfer printing or pad printing, as shown in FIG. 15. To be specific, the transition body 3 may be a colloid.

Figure 16:
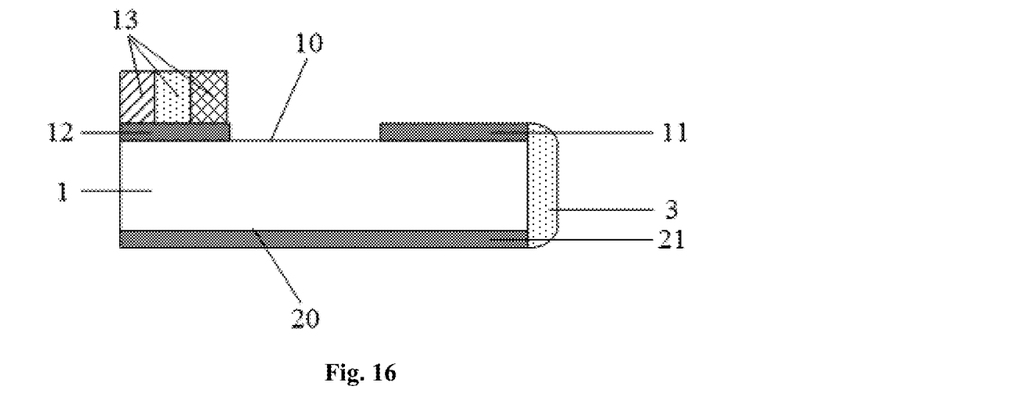
FIG. 16 is a sectional view of the display panel after heating the colloid according to one embodiment of the present disclosure.

Step 3: treating an edge of the colloid through heating to provide the colloid with an arc-like shape at the edge, as shown in FIG. 16.

Step 4: performing a side wiring process, i.e., enabling each first wiring 11 to be connected to the corresponding second wiring 21 through pad printing or transfer printing, so as to enable an IC signal line on the back surface to be connected to the data line and the signal line for the shift register on the front surface, as shown in FIG. 9; and Step 5: enabling the side line to be covered by the light-shielding colloid 5 (BM OC) through transfer printing or pad printing, so as to prevent the display effect from being adversely affected when light is reflected by the metal connection lines, as shown in FIG. 10.

In other words, in the embodiments of the present disclosure, after the cutting, the conventional chamfering process may be replaced by the attachment of the colloid, so as to reduce the width of the bezel and provide the display panel with an ultra-narrow bezel (i.e., reduce a distance between an LED chip and an edge of the display panel), provide higher Pixels Per Inch (PPI) as compared with the chamfering process, and prevent the occurrence of an Open defect at a chamfering position.

The present disclosure has the following beneficial effect. According to the embodiments of the present disclosure, the display panel may include the plurality of first wirings on the display surface, the plurality of second wirings on the display back surface, and the transition body on the side surface. The outer surface of the transition body away from the side surface may be arc-shaped at the corner. When the transition body is subsequently covered by the connection lines, it is able to prevent the connection lines from being easily broken at the corner as compared with the related art. In addition, in the embodiments of the present disclosure, due to the formation of the transition body on the side surface of the display panel, it is unnecessary to perform a chamfering process, i.e., it is able to prevent the occurrence of a wider bezel for the display panel when the base substrate includes a chamfering margin having a large width, thereby to provide the display panel with a narrow bezel.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
   a base substrate comprising a display surface and a display back surface arranged opposite to each other, and a side surface connected to the display surface and the display back surface;
   a plurality of first wirings formed on the display surface of the base substrate;
   a plurality of second wirings formed on the display back surface of the base substrate;
   a transition body arranged on the side surface of the base substrate and in contact with the first wirings and the second wirings, a surface of the transition body away from the side surface being a smooth curved surface; and
   a plurality of connection lines covering an outer surface of the transition body, each first wiring being electrically connected to a corresponding second wiring via a corresponding connection line.

2. The display panel according to claim 1, wherein the transition body comprises a first end portion in contact with the first wiring and a second end portion in contact with the second wiring, and an outer surface of each of the first end portion and the second end portion away from the side surface is arc-shaped at a corner.

3. The display panel according to claim 2, wherein a contact surface between the first wiring and the first end portion is flush with an edge of the base substrate, and a contact surface between the second wiring and the second end portion is flush with the edge of the base substrate.

4. The display panel according to claim 2, wherein an upper end of the first end portion is flush with an outer surface of the first wiring away from the display surface, and a lower end of the second end portion is flush with an outer surface of the second wiring away from the display back surface.

5. The display panel according to claim 1, wherein the transition body comprises a colloid, and a coefficient of thermal expansion of the colloid is the same as a coefficient of thermal expansion of the connection line.

6. The display panel according to claim 5, wherein a maximum thickness of the transition body in a direction perpendicular to the side surface does not exceed 10 micrometers.

7. The display panel according to claim 1, wherein the outer surface of the transition body away from the side surface is arc-shaped or elliptic arc-shaped at the corner.

8. The display panel according to claim 1, further comprising a light-shielding colloid covering an outer surface of each connection line.

9. A method for manufacturing a display panel, comprising:
   forming a plurality of first wirings on a display surface of a base substrate;

forming a plurality of second wirings on a display back surface of the base substrate opposite to the display surface;

forming a transition body on a side surface of the base substrate connected to the display surface and the display back surface, the transition body being in contact with the first wirings and the second wirings, and a surface of the transition body away from the side surface being a smooth curved surface; and forming a plurality of connection lines covering an outer surface of the transition body, each first wiring being electrically connected to a corresponding second wiring via a corresponding connection line.

10. The method according to claim 9, wherein the forming the transition body on the side surface of the base substrate comprises:

forming a colloid on the side surface of the base substrate; and heating the colloid so that an outer surface of the colloid away from the side surface is arc-shaped at a corner.

11. The method according to claim 10, wherein the forming the colloid on the side surface of the base substrate comprises attaching the colloid on the side surface of the base substrate through transfer printing or pad printing.

12. The method according to claim 9, wherein the forming the plurality of connection lines on the outer surface of the transition body comprises forming the plurality of connection lines on a surface of the transition body away from the side surface through transfer printing or pad printing.

13. The method according to claim 9, wherein subsequent to forming the plurality of connection lines on the outer surface of the transition body, the method further comprises forming a light-shielding colloid on an outer surface of each connection line through transfer printing or pad printing.

14. The method according to claim 9, wherein prior to forming the plurality of first wirings on the display surface of the base substrate, the method further comprises cutting a motherboard through a laser cutting process to obtain a plurality of display panels.

15. The display panel according to claim 3, wherein an upper end of the first end portion is flush with an outer surface of the first wiring away from the display surface, and a lower end of the second end portion is flush with an outer surface of the second wiring away from the display back surface.

16. The display panel according to claim 2, wherein the transition body comprises a colloid, and a coefficient of thermal expansion of the colloid is the same as a coefficient of thermal expansion of the connection line.

17. The display panel according to claim 3, wherein the transition body comprises a colloid, and a coefficient of thermal expansion of the colloid is the same as a coefficient of thermal expansion of the connection line.

18. The display panel according to claim 4, wherein the transition body comprises a colloid, and a coefficient of thermal expansion of the colloid is the same as a coefficient of thermal expansion of the connection line.

19. The display panel according to claim 15, wherein the transition body comprises a colloid, and a coefficient of thermal expansion of the colloid is the same as a coefficient of thermal expansion of the connection line.

* * * * *